United States Patent
Munkholm et al.

(10) Patent No.: US 10,573,781 B1
(45) Date of Patent: Feb. 25, 2020

(54) LIGHT EMITTING DIODE WITH TUNNEL JUNCTION

(71) Applicant: Facebook Technologies, LLC, Menlo Park, CA (US)

(72) Inventors: Anneli Munkholm, Cork (IE); David Massoubre, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/113,514

(22) Filed: Aug. 27, 2018

Related U.S. Application Data

(60) Provisional application No. 62/551,096, filed on Aug. 28, 2017.

(51) Int. Cl.
| | |
|---|---|
| *H01L 29/06* | (2006.01) |
| *H01L 33/06* | (2010.01) |
| *H01L 33/00* | (2010.01) |
| *H01L 33/32* | (2010.01) |
| *H01L 33/10* | (2010.01) |
| *H01L 33/24* | (2010.01) |

(52) U.S. Cl.
CPC ............ *H01L 33/06* (2013.01); *H01L 33/007* (2013.01); *H01L 33/0095* (2013.01); *H01L 33/10* (2013.01); *H01L 33/24* (2013.01); *H01L 33/32* (2013.01)

(58) Field of Classification Search
CPC ....................................................... H01L 33/06
USPC ........................................................... 438/22
See application file for complete search history.

(56) References Cited

U.S. PATENT DOCUMENTS

| | | | |
|---|---|---|---|
| 2005/0040413 A1* | 2/2005 | Takahashi | B82Y 20/00 257/96 |
| 2009/0286342 A1* | 11/2009 | Takahashi | B82Y 20/00 438/32 |

FOREIGN PATENT DOCUMENTS

EP 1205969 A2 * 5/2002 ............. H01L 29/41

OTHER PUBLICATIONS

Krishnamoorthy, S. et al, "Demonstration of forward inter-band tunneling in GaN by polarization engineering," Applied Physics Letters, Dec. 5, 2011, pp. 233504-1-233504-3, vol. 99, No. 23.

(Continued)

*Primary Examiner* — Ajay Arora
(74) *Attorney, Agent, or Firm* — Fenwick & West LLP

(57) ABSTRACT

A light emitting diode (LED) is manufactured using a process in which hydrogen diffuses out of a p-doped semiconductor layer via an exposed side wall of the p-doped semiconductor layer. The process includes forming a light generation layer on a base semiconductor layer and forming the p-doped semiconductor layer on the light generation layer. A tunnel junction layer is formed on the p-doped semiconductor layer and a contact layer is formed on the junction layer. The process also includes etching through at least the contact layer, the tunnel junction layer, and the p-doped semiconductor layer to expose the side wall of the p-doped semiconductor layer and enabling hydrogen to diffuse out of the p-doped semiconductor layer at least partially through the exposed side wall.

20 Claims, 5 Drawing Sheets

(56) References Cited

OTHER PUBLICATIONS

Yonkee, B. P. et al., "Demonstration of a III-nitride edge-emitting laser diode utilizing a GaN tunnel junction contact," Optics Express, Apr. 1, 2016, pp. 7816-7822, vol. 24, No. 7.

Young, E.C. et al., "Hybrid tunnel junction contacts to III-nitride light-emitting diodes," Applied Physics Express, Jan. 26, 2016, pp. 022102-1-022102-4, vol. 9.

\* cited by examiner

LIGHT EMITTING DIODE WITH TUNNEL JUNCTION

CROSS REFERENCE TO RELATED APPLICATIONS

This application claims the benefit of U.S. Provisional Application No. 62/551,096, filed Aug. 28, 2017, which is incorporated by reference.

BACKGROUND

1. Technical Field

The subject matter described relates generally to micro light-emitting diodes (μLEDs), and in particular to μLEDs that include a tunnel junction.

2. Background Information

A light emitting diode is an electrical component that includes a p-n junction that emits light when activated. A common type of LED used commercially is gallium-nitride (GaN) based, using p-doped and n-doped layers to create the p-n junction. A variety of dopants can be used, with magnesium (Mg) and silicon (Si) being common choices for p-doping and n-doping, respectively.

One problem that arises with existing GaN-based LEDs is that they suffer from a poor conductive anode due to the high resistance of the p-doped (e.g., Mg-doped) GaN layer. This results in a degradation of the wall-plug efficiency (WPE) and a current crowding effect preventing uniform current injection. The low miscibility of Mg atoms in thin GaN layers result in a high p-GaN resistivity. Furthermore, most commercial manufacture of GaN-based LEDs uses metal-organic chemical vapor deposition (MOCVD) which results in the formation of a magnesium-hydrogen (Mg—H) complex in the p-GaN layer. The Mg—H complex has a high activation energy, which further increases the resistivity of the layer.

As a consequence, the carrier concentration in Mg-doped GaN is limited to $<5 \times 10^{18}$ cm$^{-3}$ for a maximum [Mg] concentration of $10^{20}$ cm$^{-3}$. This in turn makes it difficult to form good ohmic contact on p-GaN with a contact resistance lower than $10^{-4}$ Ω·cm$^2$ and the high sheet resistance >50 kΩ/sq. This is particularly problematic with GaN-based μLEDs (typical size <50 μm) due to the low p-contact size and the challenging processing.

SUMMARY

The problem of poor anode conductivity can be addressed by using a tunnel junction for current injection. A GaN μLED can be fabricated with a tunnel junction that is annealed after the etching of the μLED mesa. The tunnel junction creates a low-resistance contact using the high conductivity of the n-doped GaN (n-GaN) layer. The micron size of the μLED mesa provides for easy escape of Hydrogen (H) from the underlying p-GaN layer, which would otherwise be blocked by the top Si-doped n-GaN layer. Thus, the μLED may be fabricated without the need for a regrowth step.

In one embodiment, an LED is manufactured using a process in which hydrogen diffuses out of a p-doped semiconductor layer via an exposed side wall of the p-doped semiconductor layer. The process includes forming a light generation layer on a base semiconductor layer and forming the p-doped semiconductor layer on the light generation layer. A tunnel junction layer is formed on the p-doped semiconductor layer and a contact layer is formed on the tunnel junction layer. The process also includes etching through at least the contact layer, the tunnel junction layer, and the p-doped semiconductor layer to expose the side wall of the p-doped semiconductor layer and enabling hydrogen to diffuse out of the p-doped semiconductor layer at least partially through the exposed side wall.

DETAILED DESCRIPTION

Embodiments relate to a light emitting diode (LED) manufactured using a process in which hydrogen is diffused out of a p-doped semiconductor layer via an exposed side wall of a p-doped semiconductor layer. When a tunnel junction layer is formed on the p-doped semiconductor layer, the p-doped semiconductor layer may come to include hydrogen that may deactive the p-doped semiconductor layer. The hydrogen included in the p-doped semiconductor layer is removed by diffusing through a side wall formed by etching at least the p-doped semiconductor layer. Hence, the p-doped semiconductor layer may be reactivated. Furthermore, the manufacturing process may be completed without using a regrowth process.

Figure 1:
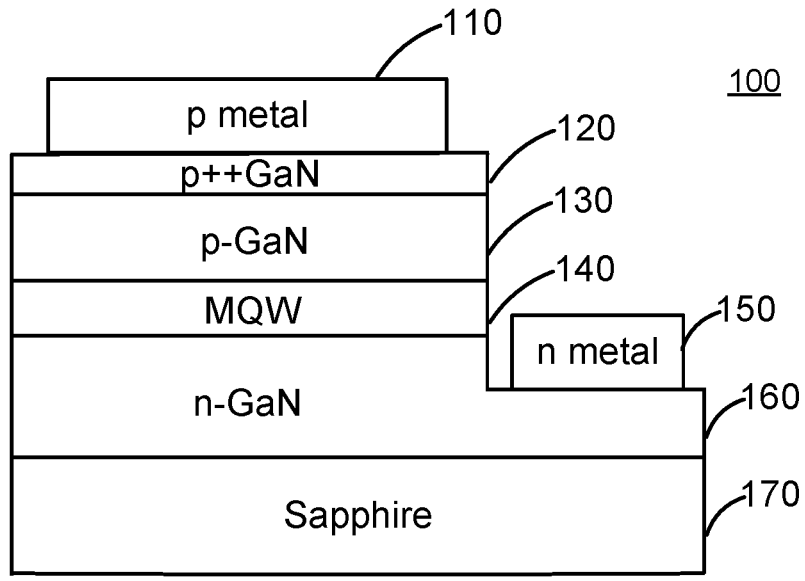
FIG. 1 is a simplified schematic cross-sectional diagram of an example GaN-based LED.

FIG. 1 is a schematic illustration of an example GaN-based LED 100. In the example show, the LED 100 is fabricated on substrate 170. The substrate 170 may be embodied, e.g., as a sapphire wafer. The LED 100 has a region containing multiple quantum wells (MQWs) 140, sandwiched between an n-GaN layer 160 and a p-GaN layer 130. This forms a p-i-n diode. A confinement layer (e.g. formed from p-AlGaN or p-AlGaN/InGaP SL) that confines electrons to the MQWs 140 may be included between the p-GaN layer 130 and the MQWs 140. The n-GaN layer 160 and/or the combination of the substrate 170 and n-GaN layer 160 are also referred to herein as "a base semiconductor layer" for convenience. An n-contact 150 is connected to an exposed portion of the n-GaN layer 160 and a p++GaN layer 120 is formed on top of the p-GaN layer 130 to provide a low-resistance connection between the p-i-n diode and a p-contact 110. In some embodiments, the p++GaN layer 120 may be omitted.

However, achieving high carrier concentration is difficult and current spreading in the p-GaN layer 130 is limited because resistivity in the LED 100 increases the forward voltage ($V_F$) with current density and therefore reduces the WPE. This problem is particularly acute for high current density LED applications (including μLED applications) such as automotive forward lighting, projectors, and displays.

Figure 2:
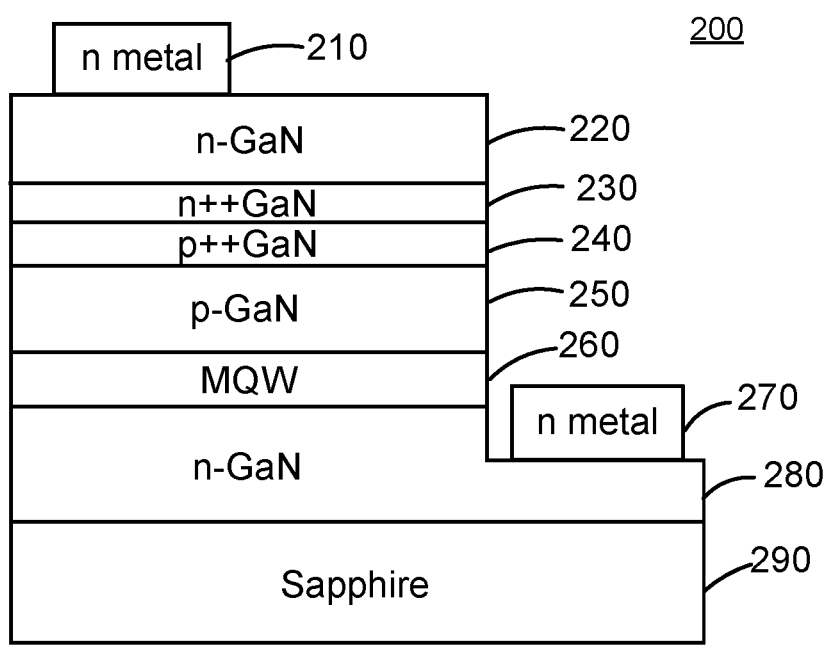
FIG. 2 is a simplified schematic cross-sectional diagram of an example GaN-based LED that includes a tunnel junction.

One solution to improve current spreading and reduce the forward voltage at high currents is to use a tunnel junction. FIG. 2 is a schematic illustration of an example GaN-based LED 200 that includes a tunnel junction. In the example shown, the bottom portion of the LED 200 is similar to the LED 100 shown in FIG. 1. It is fabricated on a substrate 290 and includes a MQW region 260 sandwiched between an n-Gan layer 280 and a P-Gan layer 250. Also similarly, an n-contact 270 is disposed on an exposed portion of the n-GaN layer 280 and a p++GaN layer 240 sits on top of the p-GaN layer 250. However, in place of the p-contact 110 is a tunnel junction including a thin n++GaN layer 230 (on top of the p++GaN layer 240) followed by a thicker n-GaN layer 220 that provides good electrical contact with an n-contact 210. In some embodiments, a thin interface material such as indium gallium nitride (InGaN) or aluminum nitride (AlN) may be used to reduce the depletion width of the tunnel junction.

Using a tunnel junction for the LED 200 can have one or more of the following benefits: (a) reduction in $V_F$ at high current densities leading to improved wall plug efficiency; (b) reduction in metal contact area on the LED's p-side due to the increased current spreading, which leads to higher light extraction efficiency and increased light output; (c) simplified processing because the same contact material can be used for both the n-side and p-side contacts; (d) improved ohmic contact on the p-side because it is easier to form an ohmic contact to n-GaN than p+GaN, which leads to lower $V_F$, higher uniformity, and higher reliability; and (e) enabling the use of N-MOS instead of the generally less efficient P-MOS.

High performance III-N LEDs are grown by MOCVD. The p-GaN layer 250 is formed by doping GaN with Mg. However, Mg forms a complex with hydrogen and is not activated until an anneal of the LED wafer has taken place in a hydrogen-free ambient. In one embodiment, the LED wafer is annealed by placing it in Nitrogen gas ($N_2$) at 800° C. for 10 minutes. Other hydrogen-free ambient environments may be used for the annealing, such as an Argon gas environment. In other embodiments, other activation processes may be used, such as microwave treatment of the p-GaN layer 250.

For an LED 200 with a tunnel junction grown by MOCVD, the p-GaN is not activated during the MOCVD process because n-GaN layer 220 acts as a diffusion barrier for H. Therefore, LEDs with tunnel junctions are formed using regrowth, where the base structure is first grown by MOCVD followed by activation of the p-GaN and then regrowth of the n-GaN layer 220 by a H-free ambient growth technique such as molecular beam epitaxy (MBE). Alternatively, the entire tunnel junction can be grown using a process such as MBE after growth of the MQWs 260 by MOCVD. In either case, a regrowth step for the p-doped semiconductor layer is typically performed when manufacturing III-N LEDs. Performing such regrowth processes limits commercial implementation of tunnel junctions for LEDs as the regrowth processes are both complex and costly. Furthermore, regrowth interfaces often unintentionally introduce contaminants such as oxygen and silicon that act as donors in GaN, which may degrade the performance of the LED 200.

In the case of μLEDs, which typically have a mesa diameter or longest axis of the order of 100 μm or less, an alternative fabrication approach may be used that does not require a regrowth step. During fabrication, the sides of the μLED mesa are etched, exposing the sides of the p-GaN layer. This approach in which a side wall of the p-GaN layer is exposed may be used with vertical mesas (described in greater detail below, with reference to FIG. 4), parabolic mesas (described in greater detail below, with reference to FIG. 5), or any other mesa shape. As long as the horizontal dimension of the device is small, hydrogen will diffuse out of the p-GaN through the exposed sidewalls during an anneal in a $N_2$ ambient after the etch. Thus, all or substantially all of the p-GaN layer may be activated, without performing a regrowth operation.

Overview of Example μLED

As used herein, the term "μLED" refers to a particular type of LED having a small active light emitting area, such as having a diameter or longest axis between 0.2-10 μm, 10-100 μm or 100-200 μm. In one example, the diameter includes 2.5-30 μm of square or circular diameter for a parabolic, conical, or super-parabolic top head profile of the μLED. In other examples, the μLED has a rectangular, elliptical, or other cross section that may be described by the length of two or more cross-sectional axes. The longest of these axes may be in various ranges, such as between 0.2-10 μm, 10-100 μm or 100-200 μm.

Figure 3:
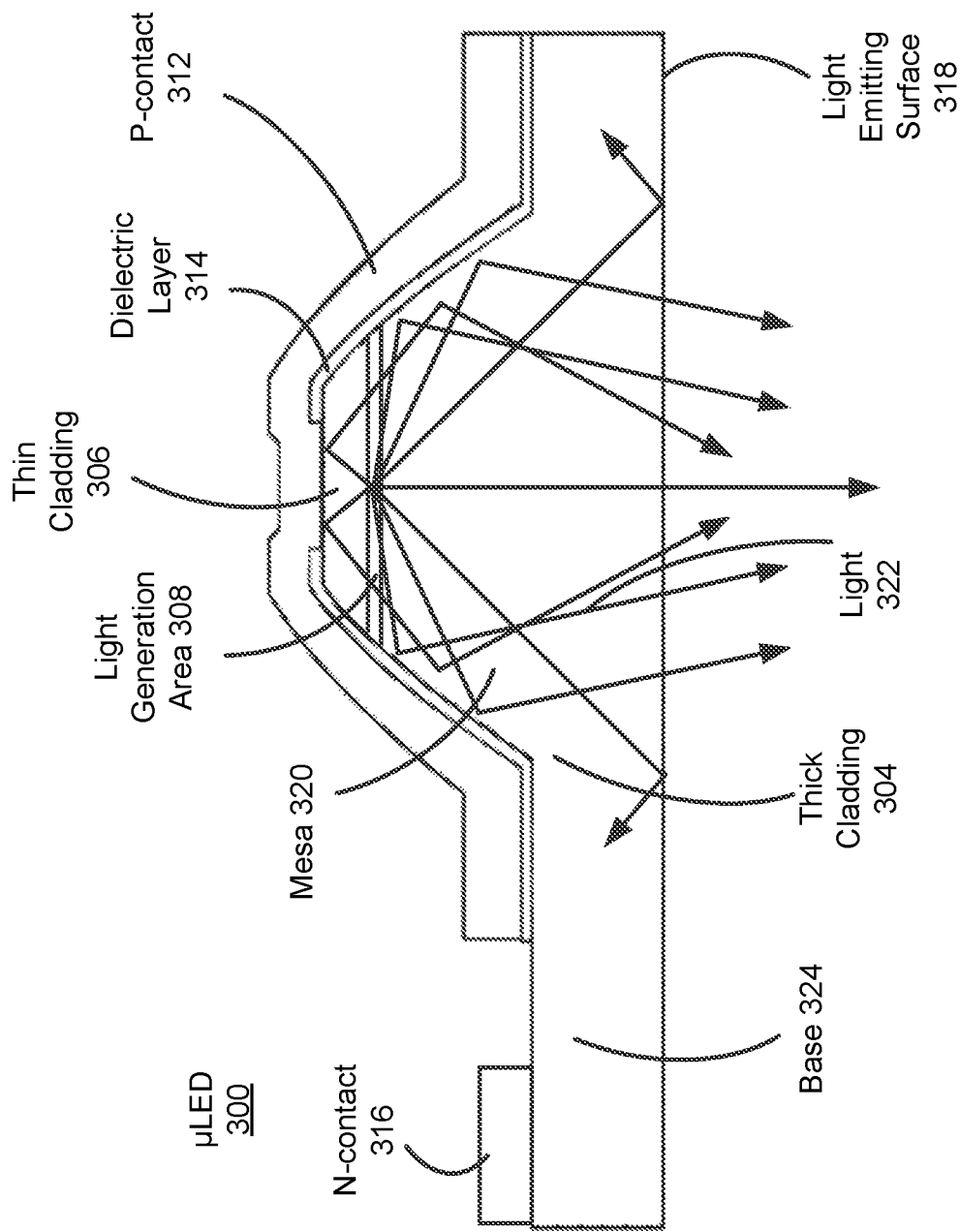
FIG. 3 is a cross-sectional diagram of a μLED, in accordance with one embodiment.

FIG. 3 is a cross section of an embodiment of a μLED 300. In the embodiment shown, the μLED 300 has a semiconductor structure including a thick cladding 304 and a thin cladding 306. A light generation area 308 is positioned between the thick cladding 304 and the thin cladding 306. The μLED 300 further includes a dielectric layer 310 on the semiconductor structure, a p-contact 312 on the dielectric layer 314, and an n-contact 316 on the thick cladding 304. Note that where a tunnel junction is used, both contacts may be n-contacts.

The semiconductor structure is shaped (e.g., via an etching process) into a mesa 320 and a base 324 of the mesa 320. The light generation area 308 is an active light generation area that is included in the structure of the mesa 320. The active light generation area 308 may include quantum wells, quantum dots, quantum wire, nano-wire, nano-fin-walls, or the like. The mesa 320 may include a truncated top defined on a side opposed to a light emitting surface 318 of the μLED 300.

In some embodiments, the semiconductor structure including the thick cladding 304, light generation area 308, and thin cladding 306 define an epitaxial structure grown on a substrate. The thin cladding 306 and the thick cladding 304 include differently doped semiconductor material layers. For example, the thin cladding 306 may include p-doped semiconductor material layers and the thick cladding 304 may include n-doped semiconductor material layers. In another example, the thin cladding 306 may include n-doped semiconductor material layers and the thick cladding 304 may include p-doped semiconductor material layers.

If the semiconductor structure of the μLED 300 is grown on a substrate, such as a non-transparent substrate, the substrate may be removed to reveal the light emitting surface 318. For example, laser-lift off may be used to remove some or all of the substrate. Removal of the substrate can result in greater light extraction and brightness The mesa 320 may be of various shapes, such as a parabolic shape with a truncated top, to form a reflective enclosure for light 322 generated within the μLED 300. In other embodiments, the mesa 320 may include a cylindrical shape with a truncated top, or a conic shape with a truncated top. The arrows show how the light 322 emitted from the light generation area 308 is reflected off the p-contact 312 and internal walls of the mesa 320 toward the light emitting surface 318 at an angle sufficient for the light to escape the µLED device 300 (i.e., within a critical angle of total internal reflection). The p-contact 312 and the n-contact 316 connect the µLED 300, such as to a display substrate including a control circuit for the µLED 300. The n-contact 316 is formed at the base 324, which is defined by a surface of the thick cladding 304 opposite the light emitting surface 318.

The µLED 300 may include an active light emitting area defined by the light generation area 308. The µLED 300 can directionalize the light output from the light generation area 308 and increases the brightness level of the light output. In particular, the mesa 320 and p-contact 312 may cause reflection of the light 322 from the light generation area 308 to form a collimated or quasi-collimated light beam emerging from the light emitting surface 318.

The mesa 320 may be formed by etching into a semiconductor structure, including the thick cladding 304, the light generation area 308, and the thin cladding 306, during wafer processing steps. The etching may result in the light generation area 308 being in the structure of the mesa 320, and at a particular distance to the p-contact 312, to facilitate the collimation of the light 322. A portion of the generated light 322 can be reflected at the mesa 320 to form a quasi-collimated light beam emitted from the light emitting surface 318. In some embodiments, the mesa 320 is between 10 and 400 µm in height and between 30 and 400 µm in width.

Example µLEDs with Tunnel Junctions

Embodiments relate to using the small size of µLEDs to enable fabrication of tunnel junctions as the LED anode without the need of a regrowth step. In one embodiment, the full heterostructure (GaN-based LED+GaN tunnel junction) is grown in a single MOCVD run. The p-GaN layer is activated by annealing after the formation of the µLED mesa. The small mesa size enables the escape of hydrogen by lateral diffusion through the exposed side wall(s).

Figure 4:
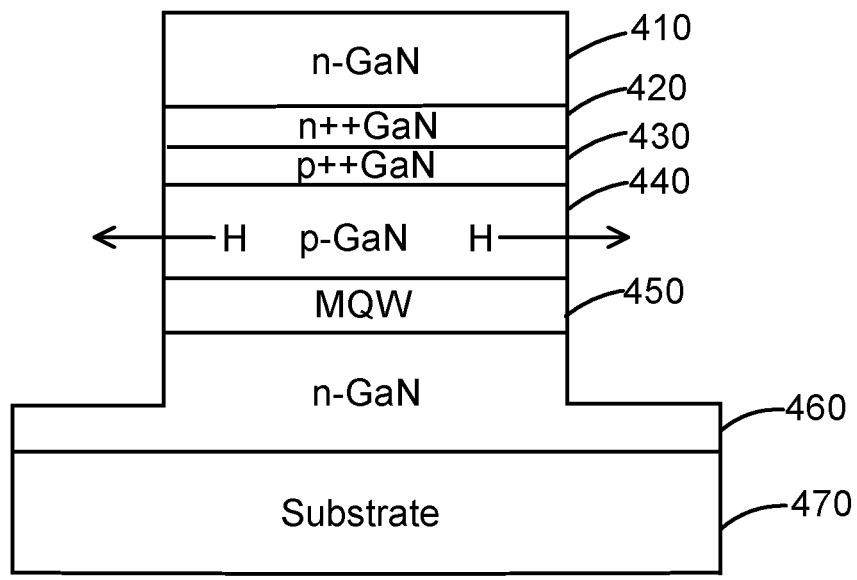
FIG. 4 is a simplified schematic cross-sectional diagram of a μLED with a tunnel junction made with a vertical mesa etch, in accordance with one embodiment.

FIG. 4 is a schematic representation of one embodiment of a GaN-based µLED 400 with a tunnel junction. In the embodiment shown, the µLED 400 has a vertical mesa and is fabricated on a substrate 470 (e.g., a silicon wafer). The µLED structure can be grown on the c-plane Ga-polar plane (GaN(0001)), the c-plane N-polar plane (GaN(000-1)), the non-polar a-plane GaN(11-20), the m-plane GaN(1-100), the semipolar planes, such as GaN(20-21) and GaN(20-2-1), or any other appropriate plane. Whichever plane is selected, a MOCVD process is used to grow, from bottom to top, an n-GaN layer 460, a MQW region 450, a p-GaN layer 440, a p++GaN layer 430, an n++GaN layer 420, and an n-GaN layer 410. The term bottom is used here to mean closest to the substrate 470 and should not be taken to imply any particular orientation of the µLED 400 during fabrication or use.

An etching process is used to shape the mesa of the µLED 400. In the embodiment shown in FIG. 4, a vertical etching is used to create a mesa with sides that are perpendicular to the surface of the substrate 470. Although the sides of the mesa are shown as completely perpendicular to the substrate surface in FIG. 4, as used herein, vertical should be construed to include mesa sides that are inclined at a slight angle (e.g., up to twenty degrees) with the mesa getting wider from top to bottom. Regardless of the precise geometry of the mesa after etching, the etching process exposes the sidewalls of the p-GaN layer 440.

After etching, the µLED structure is annealed in a $N_2$ ambient to activate the p-GaN. Because the mesa is small (relative to conventional LEDs) and the sidewalls of the p-GaN layer 440 are exposed, the hydrogen in the p-GaN layer 440 can diffuse out of the sides of the µLED structure. The relative amount of hydrogen that diffuses out of the p-GaN layer 440 can be estimated from the hydrogen diffusion length and geometry of the p-GaN layer 440. This, in turn, may be used to estimate the maximum size the mesa may be before the amount of hydrogen that does not diffuse out of the p-GaN layer 440 significantly impacts the efficiency of the µLED 400.

Figure 5:
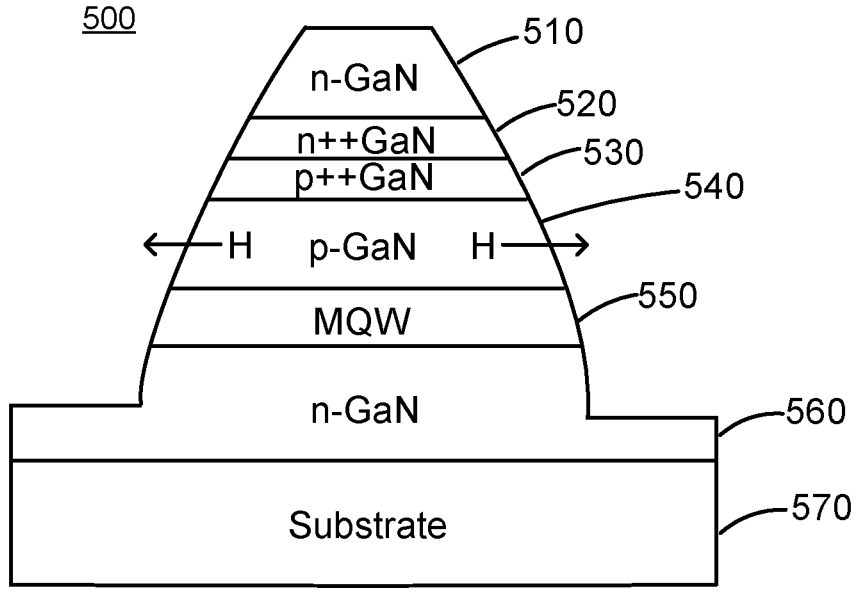
FIG. 5 is a simplified schematic cross-sectional diagram of a μLED with a tunnel junction made with a dome mesa etch, in accordance with one embodiment.

FIG. 5 is a schematic representation of another embodiment of a GaN-based µLED 500 with a tunnel junction. In this embodiment, the µLED 500 has a dome mesa. The curve of the dome mesa may be parabolic or use another curved profile. As described previously, the curve of the mesa may reflect light generated by µLED 500 to form a collimated or quasi-collimated light beam. Other than the etch, the structure and fabrication of the µLED 500 is similar to that of the µLED 400 shown in FIG. 4. The µLED 500 includes a set of layers grown on a substrate 570. The layers include, from bottom to top, an n-GaN layer 560, a MQW region 550, a p-GaN layer 540, a p++GaN layer 530, an n++GaN layer 520, and an n-GaN layer 510. As with the µLED 400 shown in FIG. 4, the layers may be grown on the substrate 570 using a MOCVD process, etched to form the dome (and expose the sidewalls of the p-GaN layer 540), and annealed (with hydrogen diffusing out of the the p-GaN layer 540 through the exposed side walls).

Example Method of Manufacturing a µLED with a Tunnel Junction

Figure 6:
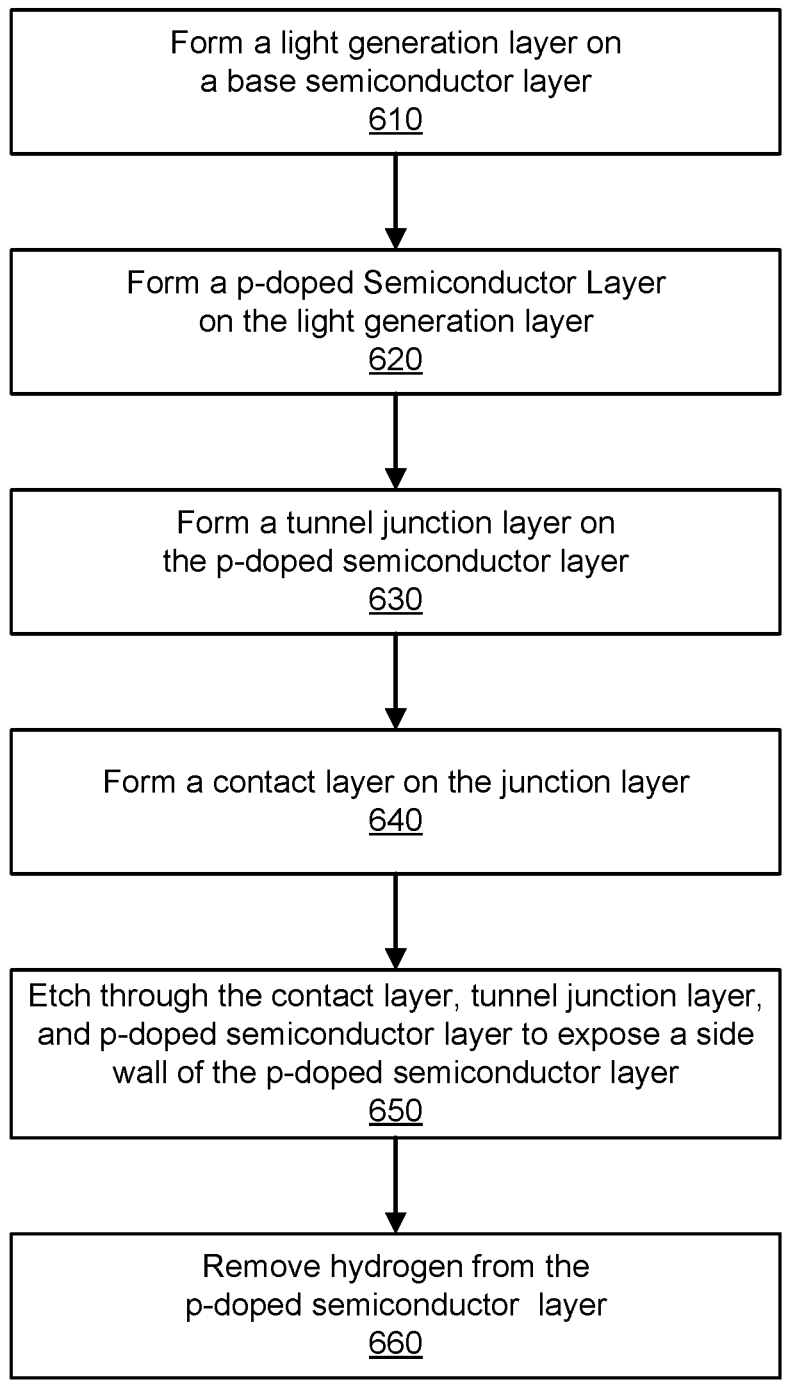
FIG. 6 is a flowchart illustrating a method for fabricating a μLED with a tunnel junction, in accordance with one embodiment.

FIG. 6 illustrates an embodiment of a method 600 for fabricating a µLED with a tunnel junction. In some embodiments, the method 600 is performed by a fabrication tool or other device (e.g., the fabrication device 730 shown in FIG. 7). Instructions for the fabrication tool to perform the method may be stored on a non-transitory computer readable medium.

In the embodiment shown, the method 600 begins with the formation 610 of a light generation layer on a base semiconductor layer. The light generation layer may be a MQW region and the base semiconductor layer may be an n-GaN layer, as described above with reference to FIGS. 4 and 5. A p-doped semiconductor layer is formed 620 on the light generation layer and a tunnel junction layer is formed 630 on the p-doped semiconductor layer. The p-doped semiconductor layer may be a p-GaN layer and the tunnel junction layer may include thin layers of p++GaN and n++GaN. In addition, a contact layer (e.g., an n-GaN layer) is formed 640 on the tunnel junction layer. The layers may be formed using MOCVD or another suitable process.

The method 600 also included etching 650 through at least the contact layer, the tunnel junction layer, and the p-doped semiconductor layer to form a mesa. In forming the mesa, a side wall of the p-doped semiconductor layer is exposed, which enables removal 660 of hydrogen from the p-doped semiconductor layer via diffusion through the exposed side wall. As described previously, the diffusion of hydrogen may occur as part of an annealing process in which the p-GaN is activated (e.g., by placing it in a $N_2$ ambient environment at 800° C. for 10 minutes). Because the hydrogen can diffuse out of the exposed side wall of the p-doped semiconductor layer during annealing, a separate regrowth step is not required. Thus, the process may be more efficient and less costly than existing methods of fabrication that include such a step.

Computing System Architecture

Figure 7:
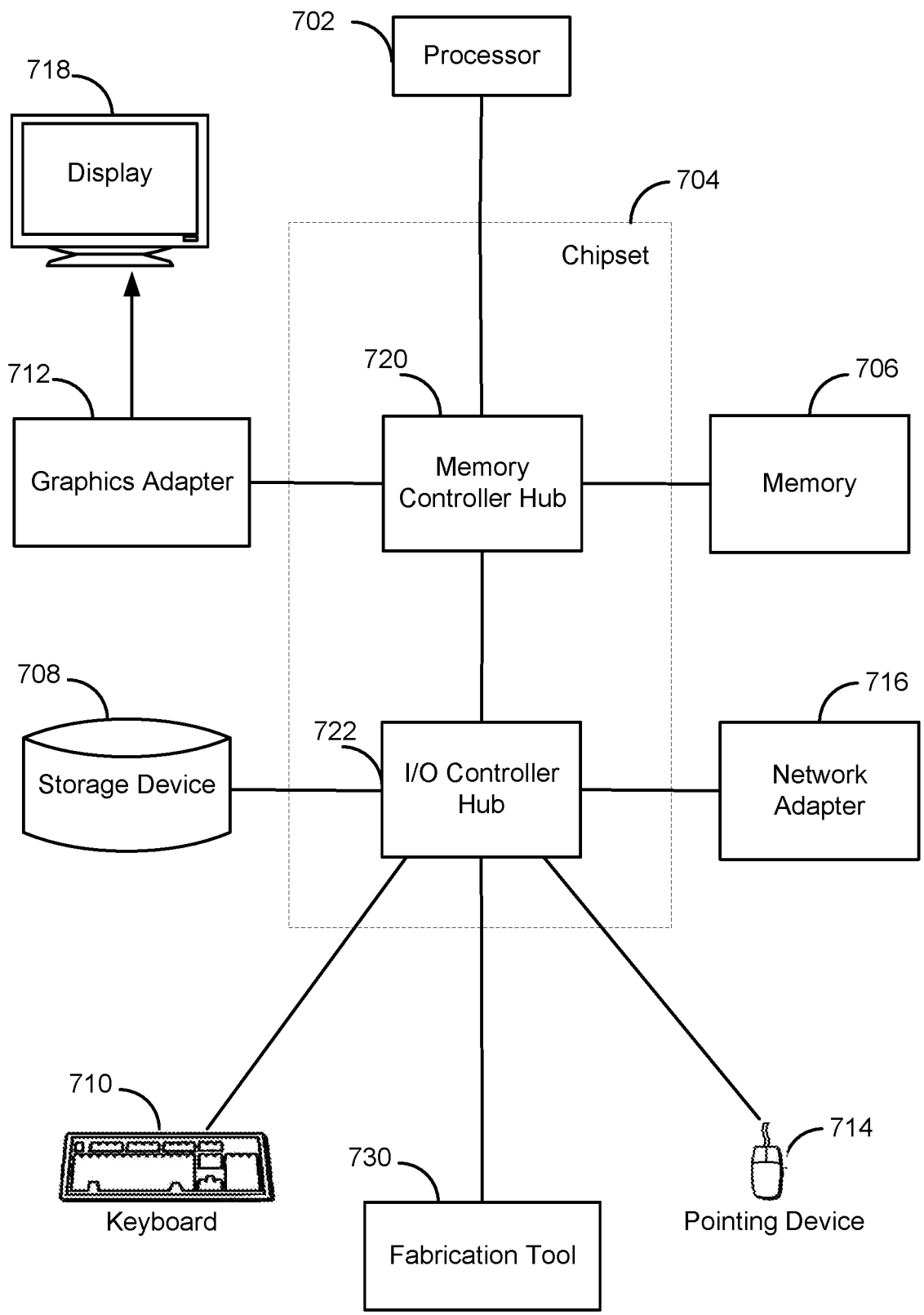
FIG. 7 is a block diagram illustrating a computer-controlled fabrication device, in accordance with one embodiment.

FIG. 7 is a block diagram illustrating an example computer controlling a fabrication device 730, in accordance with an embodiment. The example computer includes at least one processor 702 coupled to a chipset 704. The chipset 704 includes a memory controller hub 720 and an input/output (I/O) controller hub 722. A memory 706 and a graphics adapter 712 are coupled to the memory controller hub 720, and a display 718 is coupled to the graphics adapter 712. A storage device 708, keyboard 710, pointing device 714, and network adapter 716 are coupled to the I/O controller hub 722. Other embodiments of the computer have different architectures.

In the embodiment shown in FIG. 7, the storage device 708 is a non-transitory computer-readable storage medium such as a hard drive, compact disk read-only memory (CD-ROM), DVD, or a solid-state memory device. The memory 706 holds instructions and data used by the processor 702. The pointing device 714 is a mouse, track ball, touch-screen, or other type of pointing device, and is used in combination with the keyboard 710 (which may be an on-screen keyboard) to input data into the computer system 700. The graphics adapter 712 displays images and other information on the display 718. The network adapter 716 couples the computer system to one or more computer networks.

In some embodiments, the computer may include different elements and/or some elements may be omitted. For example, in one embodiment, the computer is a controller for the fabrication tool 730 and lacks a keyboard 710, pointing device 714, and display 718.

In the embodiment shown in FIG. 7, the computer is connected to a fabrication tool 730. The processor 702 executes instructions (e.g., stored in the storage device 708) that cause the fabrication tool 730 to perform certain operations, such as the steps of the method 600 described above, with reference to FIG. 6. However, the fabrication tool 730 may also be controlled by a separate computer (e.g., a desktop PC) that connects to the fabrication tool via a network (either wired or wireless).

The foregoing description of the embodiments has been presented for the purpose of illustration; it is not intended to be exhaustive or to limit the patent rights to the precise forms disclosed. Modifications and variations may be apparent in light of the embodiments described. For example, the disclosed techniques may be used to activate other p-type layers that are doped with Mg. These techniques may also be used in the fabrication of other semiconductor devices, such as vertical-cavity surface-emitting lasers. The language used has been principally selected for readability and instructional purposes, and it may not have been selected to delineate or circumscribe the inventive subject matter. The disclosure of the embodiments is intended to be illustrative, but not limiting, of the scope of the patent rights, which is set forth in the following claims.

We claim:

1. A method of manufacturing a light emitting diode (LED), comprising:
    forming a light generation layer on a base semiconductor layer;
    forming a p-doped semiconductor layer on the light generation layer;
    forming a tunnel junction layer on the p-doped semiconductor layer;
    forming a contact layer on the junction layer;
    etching through at least the contact layer, the tunnel junction layer, and the p-doped semiconductor layer to expose a side wall of the p-doped semiconductor layer; and
    enabling hydrogen to diffuse out of the p-doped semiconductor layer at least partially through the exposed side wall of the p-doped semiconductor layer.

2. The method of claim 1, wherein enabling hydrogen to diffuse out of the p-doped semiconductor layer comprises placing the etched contact layer, the etched tunnel junction layer, and the etched p-doped semiconductor layer in a nitrogen environment.

3. The method of claim 2, wherein placing the etched contact layer, the etched tunnel junction layer, and the etched p-doped semiconductor layer in a nitrogen environment is part of an annealing process that activates p-doped gallium nitride (p-GaN) in the p-doped semiconductor layer.

4. The method of claim 1, wherein a regrowth operation is not performed after forming the tunnel junction layer.

5. The method of claim 1, wherein the light generation layer comprises multiple quantum wells.

6. The method of claim 1, wherein the base semiconductor layer comprises n-doped gallium nitride (n-GaN).

7. The method of claim 1, wherein the p-doped semiconductor layer comprises p-doped gallium nitride.

8. The method of claim 1, wherein the tunnel junction layer comprises a heavily p-doped gallium nitride (p++GaN) layer and a heavily n-doped gallium nitride (n++GaN) layer, the heavily p-doped gallium nitride layer disposed on the p-doped semiconductor layer and the heavily n-doped gallium nitride layer disposed on the heavily p-doped gallium nitride layer.

9. The method of claim 1, wherein the layers are formed using metal-organic chemical vapor deposition.

10. The method of claim 1, wherein the etching forms a mesa having a longest cross-sectional axis in a range from 0.2 μm to 10 μm.

11. A non-transitory computer-readable medium configured to store instructions that, when executed by a fabrication device, cause the fabrication device to perform operations including:
    forming a light generation layer on a base semiconductor layer;
    forming a p-doped semiconductor layer on the light generation layer;
    forming a tunnel junction layer on the p-doped semiconductor layer;
    forming a contact layer on the junction layer;
    etching through at least the contact layer, the tunnel junction layer, and the p-doped semiconductor layer to expose a side wall of the p-doped semiconductor layer; and
    enabling hydrogen to diffuse out of the p-doped semiconductor layer at least partially through the exposed side wall of the p-doped semiconductor layer.

12. The non-transitory computer-readable medium of claim 11, wherein enabling hydrogen to diffuse out of the p-doped semiconductor layer comprises placing the etched contact layer, the etched tunnel junction layer, and the etched p-doped semiconductor layer in a nitrogen environment.

13. The non-transitory computer-readable medium of claim 12, wherein placing the etched contact layer, the etched tunnel junction layer, and the etched p-doped semiconductor layer in a nitrogen environment is part of an annealing process that activates p-doped gallium nitride (p-GaN) in the p-doped semiconductor layer.

14. The non-transitory computer-readable medium of claim 11, wherein the operations do not include performing a regrowth operation after forming the tunnel junction layer.

15. The non-transitory computer-readable medium of claim 11, wherein the light generation layer comprises multiple quantum wells.

16. The non-transitory computer-readable medium of claim 11, wherein the base semiconductor layer comprises n-doped gallium nitride (n-GaN).

17. The non-transitory computer-readable medium of claim 11, wherein the p-doped semiconductor layer comprises p-doped gallium nitride.

18. The non-transitory computer-readable medium of claim 11, wherein the tunnel junction layer comprises a heavily p-doped gallium nitride (p++GaN) layer and a heavily n-doped gallium nitride (n++GaN) layer, the heavily p-doped gallium nitride layer disposed on the p-doped semiconductor layer and the heavily n-doped gallium nitride layer disposed on the heavily p-doped gallium nitride layer.

19. The non-transitory computer-readable medium of claim 11, wherein the layers are formed using metal-organic chemical vapor deposition.

20. The non-transitory computer-readable medium of claim 11, wherein the etching forms a mesa having a longest cross-sectional axis in a range from 0.2 µm to 10 µm.

\* \* \* \* \*